United States Patent [19]

Smarandoiu et al.

[11] Patent Number: 4,538,245
[45] Date of Patent: Aug. 27, 1985

[54] ENABLING CIRCUIT FOR REDUNDANT WORD LINES IN A SEMICONDUCTOR MEMORY ARRAY

[75] Inventors: George Smarandoiu, Palo Alto; George Perlegos, Fremont, both of Calif.

[73] Assignee: SEEQ Technology, Inc., San Jose, Calif.

[21] Appl. No.: 367,331

[22] Filed: Apr. 12, 1982

[51] Int. Cl.³ ............................................. G11C 11/40
[52] U.S. Cl. .................................... 365/200; 365/210
[58] Field of Search .................. 365/200, 210; 371/10

[56] References Cited

U.S. PATENT DOCUMENTS 4,250,570 2/1981 Tsang et al. ...................... 365/200

OTHER PUBLICATIONS

W. F. Beausoleil, "Utilization of Defective Memory Chips by Substituting Redundant Words for Defective Words", IBM Tech. Disc. Bull., vol. 15, No. 6, Nov. 1972, pp. 1864–1865.

Primary Examiner—Joseph A. Popek
Attorney, Agent, or Firm—Lyon & Lyon

[57] ABSTRACT

A semiconductor memory having back-up storage devices arranged along redundant word lines to replace defective storage devices located in the primary array of the memory. The memory includes a redundant decoder for enabling the redundant word lines in response to a selected address and a redundancy disable circuit for generating a signal indicative of redundant word line use.

30 Claims, 6 Drawing Figures

ENABLING CIRCUIT FOR REDUNDANT WORD LINES IN A SEMICONDUCTOR MEMORY ARRAY

TECHNICAL FIELD

The present invention relates to peripheral circuits for use with semiconductor memories employing MOS storage devices arranged in primary and redundant array configuration and is more particularly directed to a circuit which enables the redundant word lines in the redundant array for the purpose of providing back-up storage capacity should any of the storage devices in the primary array fail.

BACKGROUND ART

The use of MOS floating gate storage devices in semiconductor memories has increased rapidly in recent years. A typical MOS floating gate storage device includes a floating gate structure disposed over the surface of a semiconductor substrate between spaced-apart source and drain regions. A control gate is then vertically aligned with the floating gate. In order to program the storage device, a potential is applied to the control gate such that charge carriers are transported between the semiconductor substrate and the floating gate, whereupon the threshold voltage in the channel region established between the spaced-apart source and drain regions is modified. During read operations, the presence or absence of charge carriers on the floating gate can be determined by simply measuring the presence or absence of current flow through the channel region in response to voltage potentials applied to the drain region. When floating gate storage devices of the type described above are incorporated in a semiconductor memory array, individual floating gates are utilized for each storage device while a single conductive strip is generally etched to define the control gates for all of the storage devices in a single memory array row. This single conductive strip is commonly known as a word line. The memory array is prepared for programming or read operations by enabling the word line of a particular memory array row using a unique x-address applied to the address inputs of the memory array. During manufacture of the memory array, defects in various storage devices positioned along one or more rows in the memory array may occur, giving rise to erroneous data readouts when the word line connected to the defective storage devices are addressed. In order to salvage memory arrays having such faulty word lines, semiconductor manufacturers often construct memory arrays with several additional or redundant rows of storage devices, each redundant row being tied to a redundant word line. If a faulty word line is located during quality control examination of the memory array, the x-address of the faulty word line is programmed into an enabling circuit for one of the redundant word lines. Thereafter, whenever the faulty word line is addressed, the redundant word line will instead be enabled. It can thus be seen that the presence of redundant word lines in a semiconductor memory array significantly increases the manufacturing yield from any batch of memory arrays undergoing simultaneous construction. Despite the advantages inherent in increased manufacturing yields, however, prior art redundant row techniques do not provide any means for determining whether the redundant word lines of a given memory array have, in fact, been programmed for use. Hence, the provision of a means for ascertaining the status of any redundant word lines employed in a semiconductor memory array would be of obvious benefit.

DISCLOSURE OF THE INVENTION

It is accordingly an object of the present invention to construct a semiconductor memory having back-up storage devices arranged along redundant word lines for the purpose of providing back-up storage capacity, the semiconductor memory also including means for enabling the redundant word lines in response to a selected x-address and means for generating a signal indicative of redundant word line use.

This and other objects of the present invention are achieved in a semiconductor memory which employs floating gate storage devices arranged to form a primary array and a redundant array such that storage devices in the redundant array can be activated to replace defective storage devices in the primary array. The control gates of the storage devices in the redundant array are connected to redundant word lines enabled by a redundancy decoder. When erroneous data is obtained from a particular x-address in the primary array, that particular x-address can be programmed into the redundancy decoder by blowing selected polysilicon fuses in a series of fusible link circuits tied to a selected redundant word line such that subsequent addressing of the faulty primary word line instead enables the selected redundant word line. Once a particular x-address has been transferred from a faulty word line in the primary array to a selected redundant word line in the redundant array, a redundancy disable circuit prevents any accidental reprogramming of the redundancy decoder with respect to the selected redundant word line. The redundancy disable circuit also generates a redundancy disable signal indicative of the fact that the selected redundant word line is in use, which redundancy disable signal can be supplied to an appropriate output contact of the semiconductor memory.

BRIEF DESCRIPTION OF THE DRAWINGS

The various features, objects and advantages of the present invention will become more apparent upon consideration of the following Brief Description of the Drawings and Best Mode for Carrying Out the Invention, wherein.

BEST MODE FOR CARRYING OUT THE INVENTION

Figure 1:
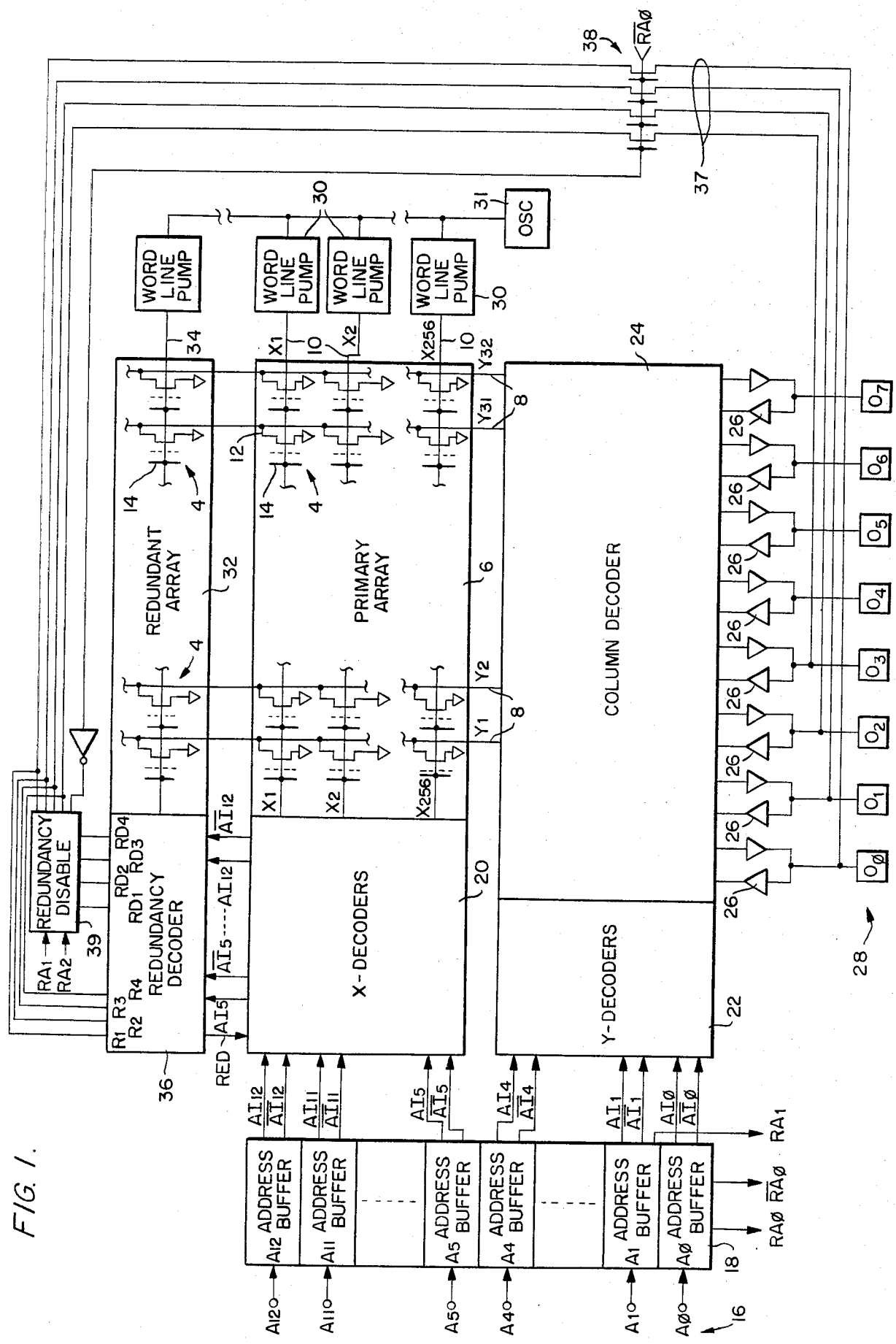
FIG. 1 is a schematic representation of a semiconductor memory comprising floating gate storage devices arranged along primary and redundant word lines to form primary and redundant arrays.

FIG. 1 schematically illustrates a semiconductor memory having a plurality of MOS storage devices 4 arranged to form a primary array 6. Each of the storage devices 4 comprises an electrically-programmable read-only floating gate structure of the type disclosed in U.S. Pat. No. 4,075,045. A series of bit lines 8 arranged in columns and primary word lines 10 arranged in rows are respectively connected to the storage device drains 12 and control gates 14, whereby each storage device may be individually programmed and read in accordance with a unique storage device address. Specifically, primary word lines 10 serve to define the x-addresses of the storage devices while bit lines 8 serve to define the storage device y-addresses. Thus, in 64k-bit embodiment, memory 2 includes two hundred and fifty-six primary word lines designated $X_1, X_2, \ldots X_{256}$ and two hundred and fifty-six bit lines designated $Y_1, Y_2, \ldots Y_{256}$. If desired, the bit lines can be subdivided into eight groups of 32 bit lines each to enable the simultaneous storage of an 8-data bit word, i.e., a data byte, using only a single y-address. In the latter event, each of the eight bit lines activated by the single y-address may be arranged in interleaved fashion.

Programming or reading of a particular storage device, or set of storage devices where bit lines 8 are divided into interleaved groups, is initiated by applying a digital address signal $A_0, A_1, \ldots A_n$ to a series of address bit inputs 16. In the 64k-bit embodiment of memory 2 described above, the first five address bits $A_0-A_4$ establish the particular y-address $Y_1, Y_2, \ldots Y_{32}$ of each data byte while an additional eight address bits $A_5-A_{12}$ establish the data byte x-address $X_1, X_2, \ldots X_{256}$. Address bit inputs 16 respectively feed the address bits $A_0-A_{12}$ to a series of address buffers 18. Each of the address buffers in turn generates an address indicator $AI_i$ and an inverted address indicator $\overline{AI}_i$, for use in decoding the address signal. That is, the output of the address buffers 18 which receive address bits $A_0-A_4$ comprise a series of address indicators $AI_0-AI_4$ and inverted address indicators $\overline{AI}_0-\overline{AI}_4$, whereas the output of the address buffers 18 which receive address bits $A_5-A_{12}$ comprise a series of address indicators $AI_5-AI_{12}$ and inverted address indicators $\overline{AI}_5-\overline{AI}_{12}$. Address indicators $AI_5-AI_{12}$ and inverted address indicators $\overline{AI}_5-\overline{AI}_{12}$ are supplied to X-decoders schematically illustrated at 20 and are combined in a digital logic system to enable the specific primary word line 10 associated with the x-address established by address bits $A_5-A_{12}$. Simultaneously, the address indicators $AI_0-AI_4$ and inverted address indicators $\overline{AI}_0-\overline{AI}_4$ are supplied to Y-decoders illustrated schematically at 22. The Y-decoders operate in conjunction with a column decoder 24, combining the various address and inverted address indicators in a digital logic system such that selected bit lines 8 associated with the y-address established by data bits $A_0-A_4$ are enabled. Data is then programmed into or read out of primary array 6 by connecting each enabled bit line 8 to the appropriate one of a pair of input/output buffers 26 respectively tied to output pads 28 and then entering or reading out the appropriate data bit $O_0-O_7$. As further disclosed in co-pending application Ser. No. 346,159 filed Feb. 5th, 1982 and incorporated herein by reference, the time required to program individual storage devices 4 in primary array 6 can be significantly reduced by increasing the programming voltage present on the primary word lines 10 associated with the individual storage devices 4. To this end, a series of word line charge pumps 30 driven by a high voltage oscillator 31 are respectively connected to primary word lines 10 in order to raise the voltages thereof to a predetermined level during memory programming operations.

Memory 2 is additionally provided with a redundant array 32 of storage devices 4 arranged along redundant word lines 34 for the purpose of providing back-up storage capacity should any of the primary word lines 10 in primary array 6 prove faulty, i.e., should any of the storage devices 4 associated with primary word lines 10 contain manufacturing defects. The redundant word lines 34 are connected to the control gates 14 of storage devices 4 to establish alternate x-addresses for the memory. When a faulty word line is present at a particular x-address in primary array 6, address indicators $AI_5-AI_{12}$ and inverted address indicators $\overline{AI}_5-\overline{AI}_{12}$ generated by address buffers 18 as a function of the address bits $A_5-A_{12}$ corresponding to the x-address of the faulty primary word line are used to program a redundancy decoder 36 such that any subsequent address signal $A_0-A_{12}$ having the x-address of the faulty word line in primary array 6 will instead enable a selected redundant word line 34 in redundant array 32. A series of control signals supplied to redundancy select lines 37 via the output pads 28 associated with data bits $O_0-O_3$ are gated through a set of redundancy enable transistors 38 to assist in programming redundancy decoder 36. Once a particular x-address has been transferred from primary array 6 to redundant array 32, a redundancy disable circuit 39 prevents any accidental reprogramming of redundancy decoder 36 relative to the selected redundant word line 34 enabled by the particular x-address. The redundancy disable circuit additionally generates a redundancy disable signal $RD_1-RD_4$ indicative of the fact that the selected redundant word line is in use, which redundancy disable signal can be supplied back through redundancy enable transistors 38 to an appropriate output pad 28.

Figure 2:
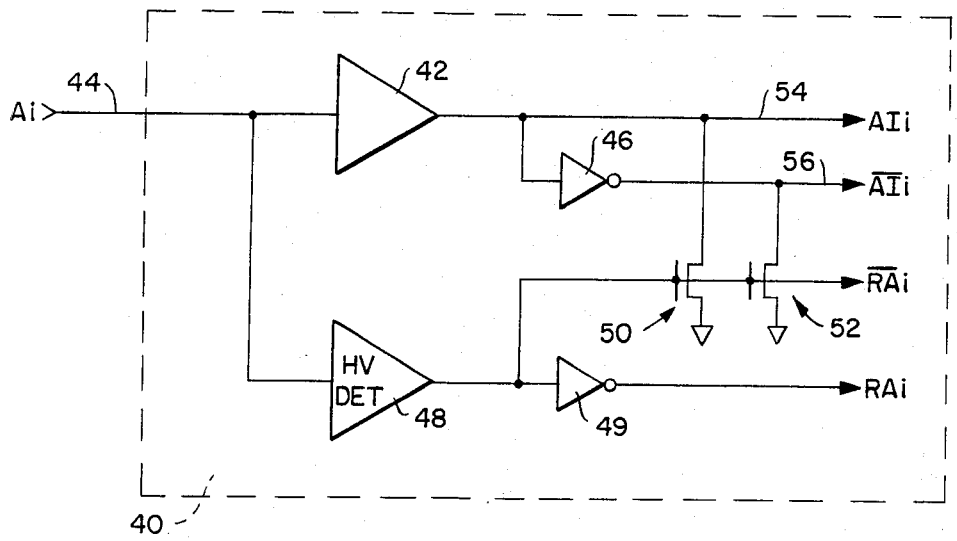
FIG. 2 is a circuit diagram of a dual-function address buffer capable of generating control signals for use in the redundancy decoder and redundancy disable circuit of the present invention.

The address buffers 18 employed in the memory 2 of the present invention may be constructed with a dual function capability, providing control signals for governing the operation of various peripheral circuits of the memory in addition to the aforementioned address and inverted address indicators $AI_0-AI_{12}$, $\overline{AI}_0-\overline{AI}_{12}$. Turning to FIG. 2, a representative address buffer 40 can be seen, it being understood that all of the address buffers 18 of FIG. 1 are similarly constructed. Address buffer 40 includes a conventional buffer/amplifier circuit 42 which receives an incoming address bit $A_i$ via input lead 44 and outputs an address indicator $AI_i$ in response thereto. The address indicator $AI_i$ switches either high or low depending upon whether address bit $A_i$ is a binary zero or a binary one. An inverter 46 connected to the output of buffer/amplifier circuit 42 provides the inverted address indicator $\overline{AI}_i$. The value of inverted address indicator $\overline{AI}_i$ is, of course, low whenever the value of address indicator $AI_i$ is high and vice versa. Address buffer 40 further includes a high voltage detector 48 which detects high voltage inputs to the address buffer, i.e., voltages significantly greater than the TTL voltages employed in conjunction with address bits $A_i$. The high voltage detector output comprises an inverted control signal $\overline{RA}_i$ which may be used for control purposes by other peripheral circuits in memory 2. Inverted control signal $\overline{RA}_i$ is passed through an inverter 49 to produce control signal $RA_i$, and is simultaneously supplied to the control gates of pull-down transistors 50, 52 respectively connected across address indicator and inverted address indicator leads 54, 56. The address buffer of the present invention thus operates in two modes. When normal TTL voltages in the form of $A_i$ address bits are present on input lead 44, address buffer 40 outputs an address indicator $AI_i$ and an inverted address indicator $\overline{AI}_i$ having complementary values determined in accordance with the binary state of address bit $A_i$. When, however, a high voltage signal (e.g., 15 v.) is applied to the input lead 44, the inverted control signal $\overline{RA}_i$ from high voltage detector 48 switches high to perform the aforementioned peripheral control functions, the control signal $RA_i$ from inverter 49 switches low to perform additional peripheral control functions and pull-down transistors 50 and 52 are gated into conduction by inverted control signal $\overline{RA}_i$ to disable the address and inverted address indicators $AI_i$, $\overline{AI}_i$.

Figure 3:
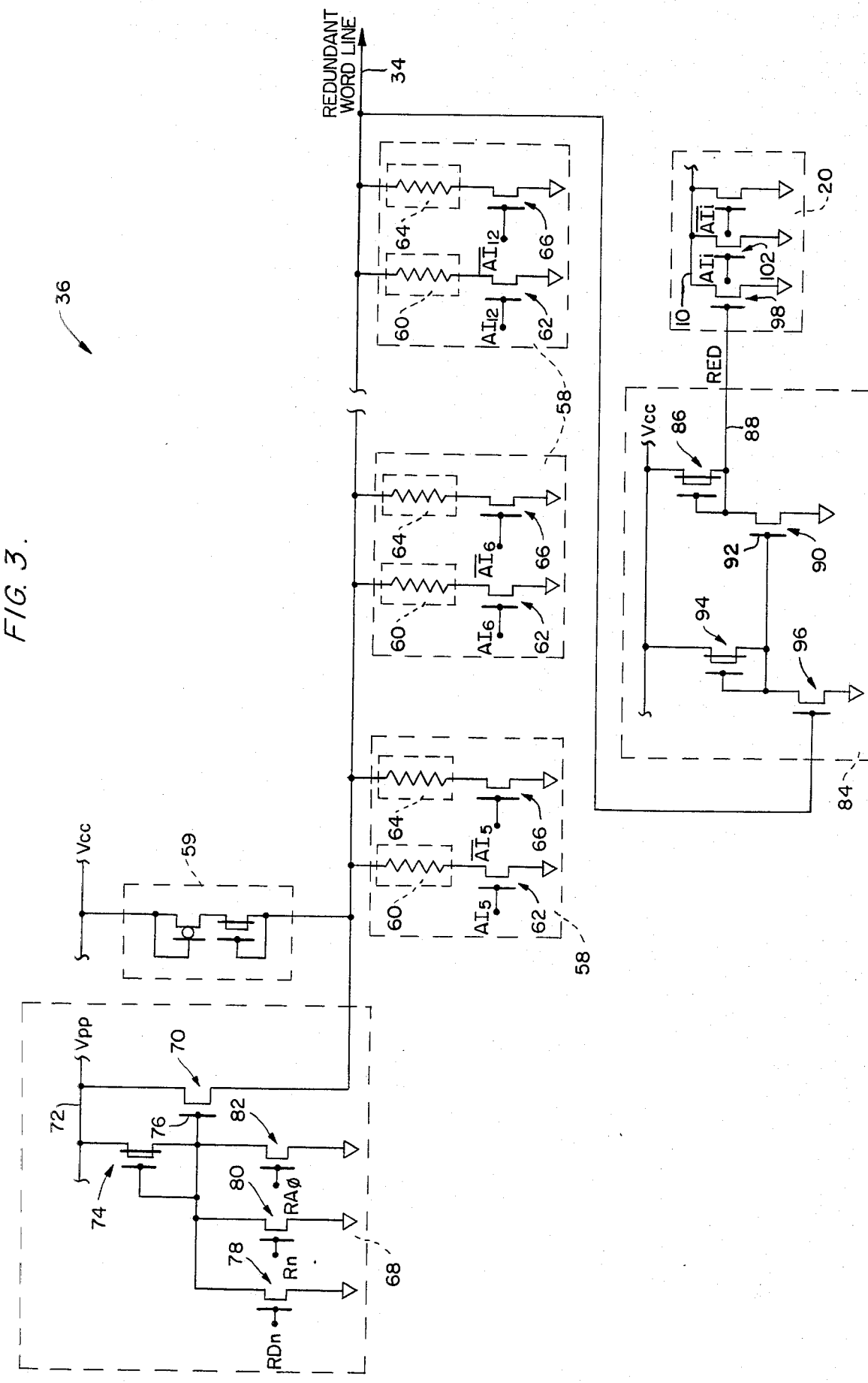
FIG. 3 is a circuit diagram of the redundancy decoder which enables the redundant word lines of the redundant array illustrated in FIG. 1, the redundancy decoder including a circuit means for disabling the primary word lines in the primary array of the FIG. 1 memory whenever any one of the redundant word lines in the redundant array of the present invention is enabled.

As previously discussed, memory 2 includes a redundancy decoder 36 which can be programmed with the x-address of a faulty word line 10 from primary array 6 such that a selected redundant word line 34 is enabled whenever the x-address of the faulty word line is input to the memory. FIG. 3 provides a detailed schematic of redundancy decoder 36, wherein the programming of the x-address associated with the faulty word line in primary array 6 is actually performed using a series of fusible link circuits 58 tied to a representative redundant word line 34. As described in greater detail hereinbelow, fusible link circuits 58 operate to enable redundant word line 34 by permitting pull-up transistors 59 to raise the voltage on redundant word line 34 whenever the x-address programmed into the fusible link circuits is input to address buffers 18. Each fusible link circuit 58 contains a fusible link 60 such as a polysilicon fuse connected between redundant word line 34 and pull-down transistor 62. Each fusible link circuit 58 also contains a fusible link 64 such as a polysilicon fuse connected between the redundant word line and pull-down transistor 66. The control gates of pull-down transistors 62 in fusible link circuits 58 are respectively connected to receive address indicators $AI_5$–$AI_{12}$ from address buffers 18, while the control gates of pull-down transistors 66 in fusible link circuits 58 are respectively connected to the corresponding inverted address indicators $\overline{AI}_5$–$\overline{AI}_{12}$. Hence, it can be seen that two alternate paths between redundant word line 34 and ground can be established for each fusible link circuit 58, one path occurring through fuse 60 when pull-down transistor 62 is conducting and the other path occurring through fuse 64 when pull-down transistor 66 is conducting. If both fuses 60 and 64 in the alternate paths to ground remain intact, it follows that redundant word line 34 will always be grounded, and thus disabled, regardless of the state of the particular address bit associated with a given fusible link circuit 58. In other words, as long as fuses 60 and 64 remain intact, either the address indicator $AI_i$ or the inverted address indicator $\overline{AI}_i$ received at a given fusible link circuit will switch high in response to the address bit $A_i$ input to the associated address buffer 18, activating the associated pull-down transistor 60 or 64 and completing a path from redundant word line 34 to ground. In contrast, where one of the two fuses 60 and 64 in a particular fusible link circuit 58 is blown, redundant word line 34 can only be grounded when the pull-down transistor 62 or 66 connected to the remaining intact fuse is conducting. The latter circumstance provides a basis for programming fusible link circuits 58 with a particular x-address by selectively blowing one or the other of the two fuses 60, 64 in each individual fusible link circuit such that the pull-down transistor 62 or 66 connected to the remaining fuse in each fusible link circuit is turned off in response to the various address indicators $AI_5$–$AI_{12}$ and inverted address indicators $\overline{AI}_5$–$\overline{AI}_{12}$ produced by the address bits $A_5$–$A_{12}$ of the particular x-address.

The actual fuse blowing for each fusible link circuit 58 is accomplished by activating a fuse blowing circuit 68 connected to one end of redundant word line 34. The fuse blowing circuit 68 includes a fuse-blowing transistor 70 connected between high voltage supply line 72 and the redundant word line. Fuse-blowing transistor 70 can be biased into conduction by a depletion mode device 74 connected between high voltage line 72 and the fuse-blowing transistor control gate 76. However, a series of three enhancement-mode pull-down transistors 78, 80 and 82 are also connected to the control gate 76 of the fuse-blowing transistor such that conduction of any one of the three pull-down transistors 78–82 acts to ground control gate 76 and shut the fuse-blowing transistor off. The control gates of pull-down transistors 78–82 are respectively connected to receive a series of control signals whenever the various fusible link circuits 58 are to be programmed. More particularly, the control gate of pull-down transistor 78 receives a representative redundancy disable signal $RD_n$ from the redundancy disable circuit 39 of FIG. 1, the control gate of pull-down transistor 80 receives a representative redundant row select signal $R_n$ from one of the redundancy select lines 37 connected to output pads $O_0$–$O_3$ of memory 2 and the control gate of pull-down transistor 82 receives a control signal $RA_0$ from the $A_0$ address buffer of memory 2.

In order to program redundancy decoder 36 with a particular x-address, a high voltage signal is applied to each of the x-address bit inputs to address buffer 18, i.e., the $A_5$–$A_{12}$ address bit inputs 16 in the 256k-bit embodiment of memory 2. The address indicators $AI_5$–$AI_{12}$ and inverted address indicators $\overline{AI}_5$–$\overline{AI}_{12}$ are consequently driven low in response to the $\overline{RA}_5$–$\overline{RA}_{12}$ outputs from the high voltage detectors in address buffers 18, as discussed in connection with FIG. 2. The low address indicators and inverted address indicators are supplied to the various pull-down transistors 62 and 66 in the fusible link circuits 58 rendering pull-down transistors 62 and 66 non-conductive. Redundancy disable circuit 39 operates as described in more detail hereinbelow to generate a representative redundancy disable signal $RD_n$. Assuming for the moment that representative redundancy disable signal $RD_n$ is low, pull-down transistor 78 is rendered non-conductive to remove one ground from control gate 76 of fuse-blowing transistor 70. A high voltage signal is supplied to the $A_0$ address bit input, whereupon the high voltage detector in the $A_0$ address buffer outputs a low control signal $RA_0$ together with a high inverted control signal $\overline{RA}_0$. The low control signal $RA_0$ renders pull-down transistor 82 non-conductive, removing another path from control gate 76 of fuse-blowing transistor 70 to ground. Meanwhile, the high $\overline{RA}_0$ signal gates redundancy enable transistors 38 into conduction, providing a direct path between output pads $O_0$–$O_3$ of memory 2 and the redundancy decoder 36. A low voltage signal, i.e., zero volts, is applied to the output pad $O_n$ associated with redundant word line 34 in FIG. 3 to furnish a low representative redundant row select signal $R_n$, rendering pull-down transistor 80 in the fuse-blowing circuit 68 non-conductive to remove the remaining ground from control gate 76 of fuse-blowing transistor 70. The various fusible link circuits 58 are then sequentially programmed by blowing one or the other of the polysilicon fuses 60, 64 as a function of the selected x-address. For example, where the $A_5$ address bit in the selected x-address is zero, the high voltage signal at the $A_5$ address bit input 16 is removed and replaced with a zero input. The $A_5$ address buffer 18 subsequently outputs a low $AI_5$ address indicator and a high $\overline{AI}_5$ inverted address indicator. Pull-down transistor 62 in the fusible link circuit 58 associated with the $A_5$ address bit thus remains non-conductive but the pull-down transistor 66 in the fusible link circuit 58 associated with the $A_5$ address bit is gated into conduction, providing a path between redundant word line 34 and ground through polysilicon fuse 64. A high voltage (e.g., 20 v.) pulse train is next applied to the high voltage supply line 72 in fuse-blowing circuit 68, periodically gating fuse-blowing transistor 70 into conduction and generating large current pulses along the direct current path now established from the high voltage supply line 72 through polysilicon fuse 64 to ground. As a result, polysilicon fuse 64 is blown and the programming of the fusible link circuit 58 associated with address bit $A_5$ is complete. The fuse-blowing process is thereafter repeated for the next fusible link circuit 58, i.e., the fusible link circuit associated with address bit $A_6$, using the value of the $A_6$ address bit in the selected x-address. Where the $A_6$ address bit is zero, the polysilicon fuse 64 in the fusible link circuit 58 associated with the $A_6$ address bit will be blown by programming the $A_6$ address bit input to a low value and pulsing high voltage supply line 72. On the other hand, where the $A_6$ address bit for the selected x-address is a one, the $A_6$ address bit input is programmed to a one value and pull-down transistor 62 in the fusible link circuit 58 associated with address bit $A_6$ will be rendered conductive during the pulsing of high voltage supply line 72 while the pull-down transistor 66 gated by the inverted address indicator $\overline{AI}_6$ will be rendered non-conductive, causing the polysilicon fuse 60 connected to pull-down transistor 62 to be blown.

The fuse-blowing process is continued until all of the fusible link circuits 58 tied to redundant word line 34 have been programmed. The representative redundancy disable signal $RD_n$ is then permanently set to a high value, returning the ground to control gate 76 of fuse-blowing transistor 70 and permanently disabling fuse-blowing circuit 68. Once the fuse-blowing circuit has been disabled, redundant word line 34 can only be enabled by programming the selected x-address into the $A_5$–$A_{12}$ address bit inputs 16. That is, in order for pull-up transistors 59 to raise the voltage of redundant word line 34 to a suitable operating level, each of the various pull-down transistors 62 or 66 connected to the remaining, intact polysilicon fuses 60 or 64 in fusible link circuits 58 must be non-conductive. This latter condition is only satisfied when the $A_5$–$A_{12}$ address bits supplied to the $A_5$–$A_{12}$ address bit inputs 16 exactly match the selected x-address used to program fusible link circuits 58. If, however, one or more of the address bits $A_5$–$A_{12}$ supplied to the address bit inputs does not match its counterpart in the selected x-address, the pull-down transistor 62 or 66 in the fusible link circuit 58 associated with the mis-matched address bit will be gated into conduction and redundant word line 34 will be grounded through the remaining, intact polysilicon fuse 60 or 64 connected to the now-conductive pull-down transistor 62 or 66. It can now be seen that the redundancy decoder 36 of the present invention provides a means for transferring the memory capacity of a faulty word line 10 in primary array 6 of memory 2 to the redundant word line 34 in redundant array 32 while preserving the unique x-address of the faulty word line 10 for use with the selected redundant word line 34.

Some provision must be made to disable the faulty primary word line 10 having the same x-address as that programmed into the fusible link circuits 58 associated with redundant word line 34. Redundancy decoder 36 therefore includes a primary array disable circuit 84 which disables all of the primary word lines 10 in primary array 6 whenever the x-address programmed to enable redundant word line 34 is input to the address buffers 18. Primary array disable circuit 84 includes a depletion-mode pull-up transistor 86 connected to lead 88 for raising the voltage level thereof and an enhancement-mode pull-down transistor 90 connected to lead 88 for grounding lead 88 when pull-down transistor 90 is conducting. The control gate 92 of pull-down transistor 90 is accordingly tied to a depletion-mode pull-up transistor 94 and an enhancement-mode pull-down transistor 96. The control gate of pull-down transistor 96 is in turn tied to redundant word line 34. When redundant word line 34 is enabled by supplying the appropriate x-address bits $A_5$–$A_{12}$ to address bit inputs 16, pull-down transistor 96 is rendered conductive to ground control gate 92 and deactivate pull-down transistor 90. Pull-up transistor 86 subsequently raises the voltage on lead 88 to provide a primary array disable signal RED. The primary array disable signal is supplied to the X-decoder 20 of memory 2 for the purpose of disabling all of the primary word lines 10 in primary array 6. More particularly, the primary array disable signal gates a pull-down transistor 98 into conduction, grounding word line 10 and rendering the various X-decoder pull-down transistors, schematically depicted at 102, ineffective. Pull-down transistors 102 are arranged in a conventional address-decoding configuration. Hence, when pull-down transistors 102 are in-effective, the various address indicators $AI_i$ and inverted address indicators $\overline{AI}_i$ from address buffer 18 are incapable of enabling the various primary word lines 10 and the entire primary memory array 6 is disabled to prevent the x-address associated with redundant word line 34 from simultaneously accessing the faulty word line 10 in the primary array. Of course, as soon as a different x-address is entered into address buffers 18, redundant word line 34 will be disabled and pull-down transistor 96 will cease conducting, bringing the voltage on control gate 92 up to the value determined by pull-up transistor 94 and gating pull-down transistor 90 into conduction to ground lead 88 and remove the RED signal from the pull-down transistors 102 in the X-decoder. All of the word lines 10 in primary array 6 can then be enabled in accordance with normal memory operating procedures.

Figure 4:
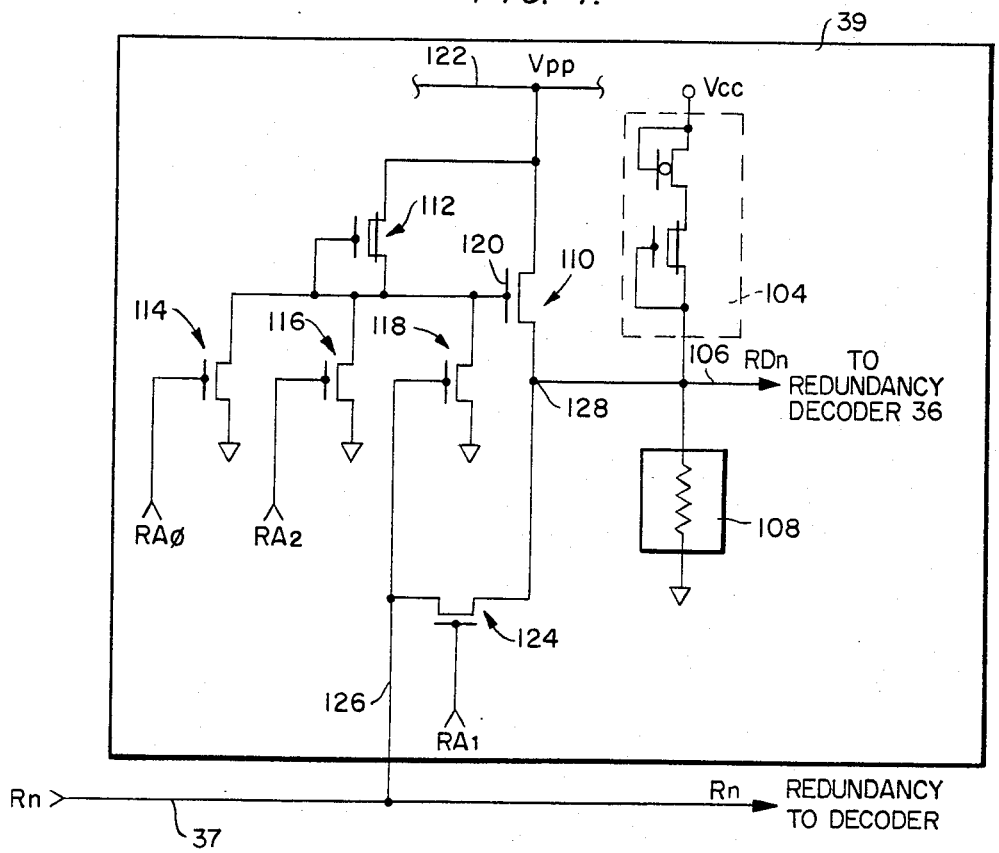
FIG. 4 is a circuit diagram of a redundancy disable circuit which prevents accidental reprogramming of the redundancy decoder illustrate,d in FIG. 3.

As indicated above, the redundancy disable circuit 39 generates a representative redundancy disable signal $RD_n$ for use in the fuse-blowing circuit 68 of FIG. 3. The redundancy disable circuit 39, illustrated in detail in FIG. 4, includes a pull-up transistor 104 tied to redundancy disable line 106. A polysilicon fuse 108 also tied to redundancy disable line 106 normally grounds the redundancy disable line to provide the aforementioned low $RD_n$ signal to pull-down transistor 82 in fuse-blowing circuit 68. However, upon completing the programming of the fusible link circuits 58 as disclosed in connection with FIG. 3, polysilicon fuse 108 is blown to permanently set the redundancy disable signal $RD_n$ high, thereby grounding the control gate 76 of fuse-blowing transistor 70 and preventing any accidental reprogramming of the fusible link circuits. A fuse-blowing transistor 110, a depletion-mode device 112 and a series of enhancement-mode pull-down transistors 114, 116 and 118 are arranged in a configuration similar to that of fuse-blowing circuit 68 for the purpose of blowing polysilicon fuse 108. The control gates of pull-down transistors 114 and 116 are respectively connected to receive control signals $RA_0$ and $RA_2$ from the address buffers 18 of FIGS. 1 and 2, whereas the control gate of pull-down transistor 118 is connected to receive the representative redundant row select signal $R_n$ from output pads 28. It will be recalled that $R_n$ is set low during the programming of fusible link circuits 58, and pull-down transistor 118 is consequently rendered non-conductive. It will also be recalled that the $RA_0$ control signal is low in response to the high voltage input applied to the $A_0$ address bit input, and pull-down transistor 114 is also rendered non-conductive. After the fusible link circuits 58 have been programmed, a high voltage signal is applied to the $A_2$ address bit input of the $A_2$ address buffer to provide a low $RA_2$ output from the high voltage detector in the $A_2$ address buffer as previously disclosed in connection with FIG. 2. The third and final pull-down transistor 116 is accordingly rendered non-conductive to completely remove ground from the control gate 120 of fuse-blowing transistor 110. Voltage pulses are then applied to high voltage supply line 122, periodically bringing depletion-mode device 112 into conduction to gate fuse-blowing transistor 110. The large current pulses generated by fuse-blowing transistor 110 in response to the conduction of depletion-mode device 112 pass through polysilicon fuse 108 to ground, in the process blowing the polysilicon fuse 108. The ground is thus removed from redundancy disable line 106 and the presence of pull-up transistor 104 in turn sets the redundancy disable signal $RD_n$ on redundancy disable line 106 to a permanently high value. With $RD_n$ set to a permanently high value, the pull-down transistor 78 in the fuse-blowing circuit 68 of redundancy decoder 36 is effectively "locked" into conduction, permanently grounding the control gate 76 of fuse-blowing transistor 70 and preventing the fusible link circuits 58 in the redundancy decoder 36 from ever being reprogrammed.

If desired, the redundancy disable signal $RD_n$ can be read out of redundancy disable circuit 39 by connecting a transistor 124 between the control gate lead 126 of pull-down transistor 118 and voltage node 128 on redundancy disable line 106. Lead 126 is connected to an appropriate one of the $O_0$–$O_3$ output pads 28 through the redundancy select lines 37. The control gate of transistor 124 receives the $RA_1$ control signal output from the high voltage detector present in the $A_1$ address buffer. Whenever a low voltage signal is applied to the $A_1$ address bit input, $RA_1$ switches high to activate transistor 124 and transfer the $RD_n$ signal from voltage node 128 to the lead 126. The $A_0$ address bit input is next driven high to generate a high $\overline{RA_0}$ signal, bringing the redundancy enable transistors 38 into conduction and permitting the value of $RD_n$ to be read at the appropriate $O_0$–$O_3$ output pad 28. In this manner, it is possible for the user of memory 2 to ascertain whether a redundant word line 34 has been programmed or not.

Figure 5:
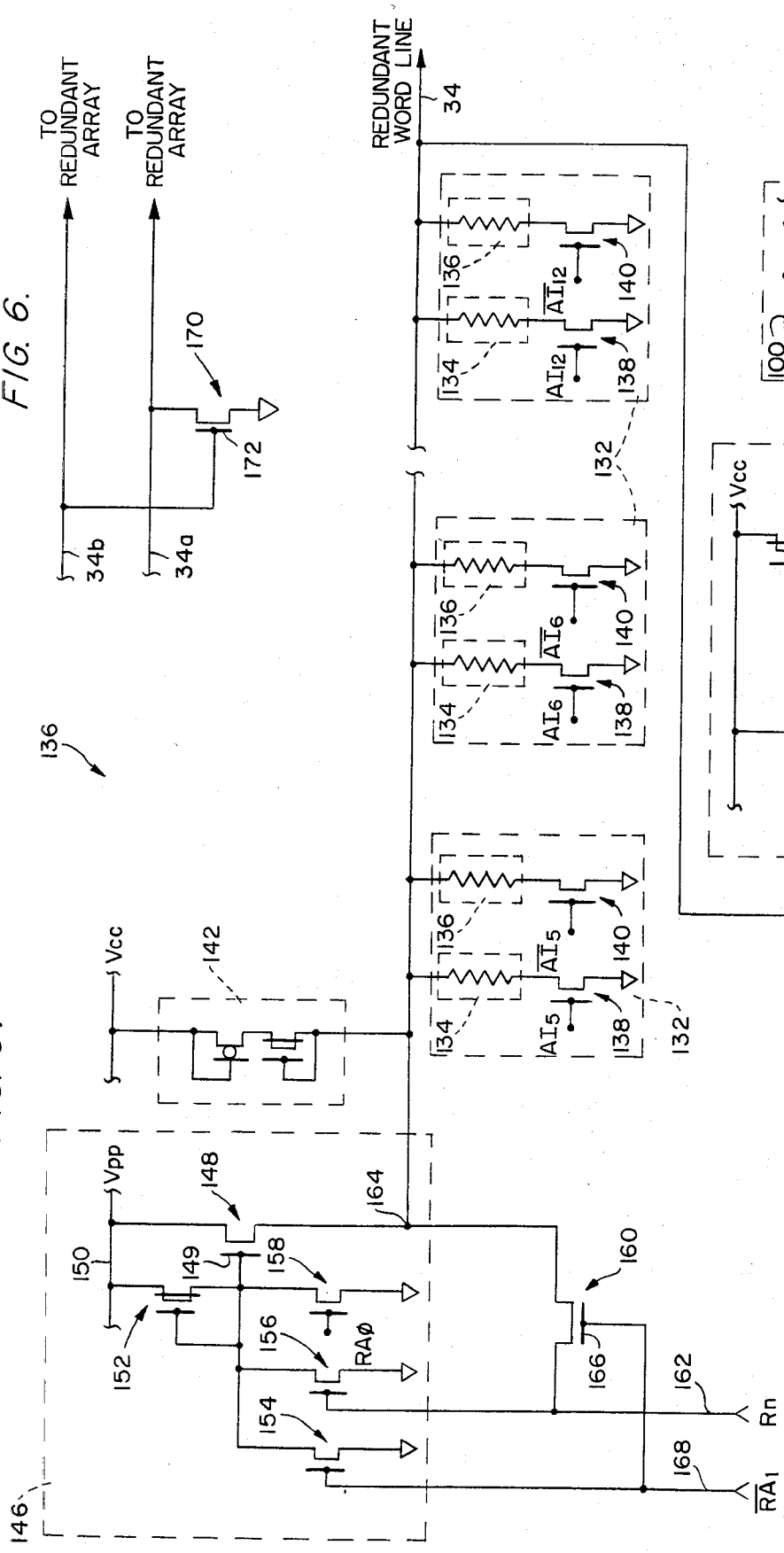
FIG. 5 is an alternate embodiment of a redundancy decoder utilized with the redundant array of FIG. 1.

As described above, redundancy disable circuit 39 is designed to accomplish two purposes. The first is to provide a means for disabling redundancy decoder 36 such that inadvertent or accidental reprogramming of the redundancy decoder is prevented. The second is to provide a means for detecting the programmed or non-programmed status of an individual redundant word line 34. Although provision of a means for generating a signal indicative of redundant word line use is important to the practice of the present invention, the redundancy decoder disabling means can be eliminated without seriously endangering the integrity of a programmed redundancy decoder. Specifically, inasmuch as redundancy decoder programming is an activity generally performed by the memory manufacturer, inadvertent or accidental reprogramming of redundancy decoder 36 can be prevented with a sufficient degree of reliability by implementing a rigorous programming control procedure during the redundancy decoder programming phase of the manufacturing operation. If the latter approach is adopted in lieu of utilizing the redundancy decoder disabling means described above in connection with FIG. 4, redundancy disable circuit 39 can be removed entirely from memory 2 and the redundancy decoder 36 modified to furnish the necessary information concerning redundant word line use. Such a modified redundancy decoder 130 is illustrated in FIG. 5. Redundancy decoder 130 is similar in both structure and function to the redundancy decoder 36 of FIG. 3 and employs fusible link circuits 132 comprised of fusible links 134 and 136 respectively connected to ground through pull-down transistors 138 and 140. Pull-up transistors 142 again operate to raise the voltage on redundant word line 34 whenever the x-address programmed into the fusible link circuits is input to address buffers 18, while a primary array disable circuit 144 is again activated to disable all of the primary word lines 10 in primary array 6 in response to the voltage increase on redundant word line 34. A fuse-blowing circuit 146 in redundancy decoder 130 includes a fuse-blowing transistor 148 having a control gate 149 connected on the one hand to high voltage supply line 150 through depletion-mode device 152 and on the other hand to ground through enhancement-mode pull-down transistors 154, 156 and 158. As with fuse-blowing circuit 68 in the redundancy decoder 36 of FIG. 3, the control gates of pull-down transistors 156 and 158 of fuse-blowing circuit 146 in redundancy decoder 130 respectively receive a representative redundant row select signal $R_n$ from one of the redundancy select lines 37 and the control signal $RA_0$ from the $A_0$ address buffer of the memory. The control gate of pull-down transistor 154, however, receives the inverted control signal $\overline{RA_1}$ from the $A_1$ address buffer rather than the redundancy disable signal $RD_n$ from redundancy disable circuit 39. Fuse-blowing transistor 148 is consequently biased into conduction by supplying a high-voltage signal to the $A_0$ address bit input while maintaining at TIL level at the $A_1$ address bit input and taking the output pad $O_n$ associated with redundant word line 34 low. The resulting low control, inverted control and redundant row select signals $RA_0$, $\overline{RA_1}$ and $R_n$ bias pull-down transistors 154-158 into an off condition, removing the ground from control gate 149 of fuse-blowing transistor 148 and permitting depletion-mode device 152 to gate fuse-blowing transistor 148 into conduction. Programming of the fusible link circuits 132 in accordance with a selected x-address is then carried out as disclosed in connection with the programming of fusible link circuits 58 in redundancy decoder 36 of FIG. 3.

Monitoring of the status of redundant word line 34 with redundancy decoder 130 is carried out by connecting a transistor 160 between the control gate lead 162 of pull-down transistor 156 and a voltage node 164 on redundant word line 34. Lead 162 is, of course, connected through an appropriate one of the redundancy select lines 37 to the associated $O_n$ output pad for the purpose of receiving the redundant row select signal $R_n$. The control gate 166 of transistor 160 is simultaneously connected to the control gate lead 168 of pull-down transistor 154. It will be recalled that the control gate of pull-down transistor 154 receives the inverted control signal $\overline{RA_1}$ from the $A_1$ address buffer. Hence, application of a high-voltage (e.g., 15 v.) signal to the $A_1$ address bit input renders transistor 160 conductive. In order to determine whether redundant word line 34 has been programmed with a particular x-address, all that need be done is to drive the $A_0$ and $A_1$ address bit inputs to address buffers 18 high. The redundancy enable transistors 38 and transistor 160 are brought into conduction, effectively connecting voltage node 164 to the $O_n$ output pad 28. Each of the two hundred and fifty-six x-addresses of memory 2 are subsequently monitored by successively applying the appropriate address bits $A_5-A_{12}$ to the $A_5-A_{12}$ address bit inputs. If a given x-address has been programmed into redundancy decoder 130, the application of that x-address to the $A_5-A_{12}$ address bit inputs will drive the voltage on redundant word line 34 high, whereupon a corresponding increase in the voltage at voltage node 164 can be detected at the $O_n$ output pad. It should now be evident that redundancy decoder 130 permits the ultimate user of memory 2 to ascertain whether redundant word line 34 has in fact been programmed by the manufacturer to replace a faulty primary word line 10 in primary array 6 and, if so, what the x-address of the faulty primary word line 10 is.

Figure 6:
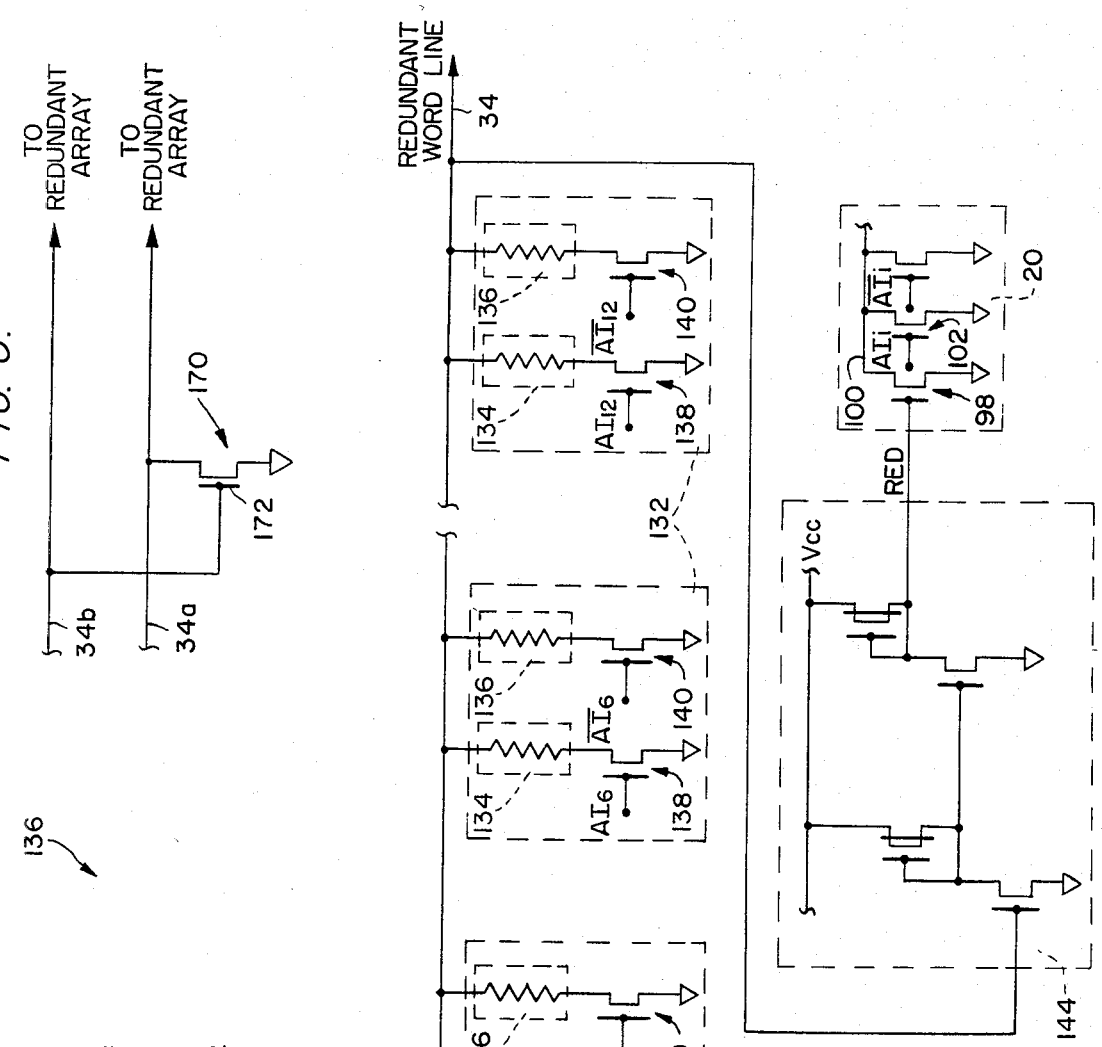
FIG. 6 depicts a circuit configuration designed to permit substitution of one redundant word line for another in the redundant array of FIG. 1.

Although a single representative redundant word line 34 has been employed throughout in describing the present invention, it is understood that additional redundant word lines can be constructed in redundant array 32. Each additional redundant word line is connected to a group of fusible link circuits such as fusible link circuits 58 or 132 in redundancy decoder 36 or 130, and a fuse-blowing circuit such as fuse-blowing circuit 68 or 146 is used to program the group of fusible link circuits associated with the additional redundant word line. For example, where redundant array 32 contains four redundant word lines 34, the various fusible links associated with a selected redundant word line may be programmed with a particular x-address by applying the appropriate one of four redundant row select signals $R_1-R_4$ to the associated $O_0-O_3$ data bit output pads 28. Thereafter, as explained in connection with FIGS. 3 and 5, pull-down transistors 78-82 in fuse-blowing circuit 68 or pull-down transistors 154-158 in fuse-blowing circuit 146 associated with the selected redundant word line are rendered non-conductive and the various fuses in the fusible link circuits associated with the selected redundant word line are blown in accordance with the particular x-address. A primary array disable circuit 84 or 144 is connected to each additional redundant word line to simultaneously disable all of the word lines 10 in primary array 6 when the selected one of the redundant word lines is enabled by the particular x-address. If the circuit configuration of redundancy decoder 36 illustrated in FIG. 3 is adopted for use with plural redundant word lines, a redundancy disable circuit such as redundancy disable circuit 39 is used to generate a redundancy disable signal for each additional redundant word line. After the programming of the fusible link circuits in redundancy decoder 36 has been completed for a selected redundant word line, the polysilicon fuse 108 in the redundancy disable circuit 39 associated with the selected redundant word line is blown to permanently set the appropriate one of four redundancy disable signals $RD_1-RD_4$ high, disabling the fuse-blowing circuit 68 associated with the selected redundant word line.

Where redundant array 32 comprises more than one redundant word line 34, redundant array 32 can compensate for defects in the construction of either redundant or primary array storage devices 14. That is, if a first redundant word line programmed to replace a faulty primary word line 10 itself proves faulty, the x-address of the faulty primary word line can be programmed instead into a second redundant word line to replace the first redundant word line. Some provision must then be made to disable the faulty redundant word line whenever the second redundant word line is accessed. To this end, FIG. 6 illustrates a circuit configuration for two representative redundant word lines 34a and 34b in a multi-word line redundant array wherein the source of a pull-down transistor 170 is connected to redundant word line 34a and the drain of pull-down transistor 170 is connected to ground. The control gate 172 of pull-down transistor 170 is connected to redundant word line 34b. Redundant word line 34a can be programmed with a particular x-address using a redundancy decoder such as 36 or 130. If, however, redundant word line 34a is later found to be faulty, the particular x-address can be reprogrammed in redundancy decoder 36 or 130 to enable redundant word line 34b. It can be seen that an increase in the voltage of redundant word line 34b gates pull-down transistor 170 into conduction to ground redundant word line 34b. As a consequence, even though both redundant word lines 34a and 34b will be accessed when the particular x-address is supplied to the $A_5-A_{12}$ address bit inputs 16 of memory 2, only redundant word line 34b will actually be enabled to provide the replacement for the faulty word line 10 in primary array 6. If desired, the circuitry illustrated in FIG. 6 could be applied to more than two redundant word lines by suitable arrangement of pull-down transistors and control gate connections, but in most applications the single redundant word line back-up configuration of FIG. 6 will suffice.

The present invention has been set forth in the form of two preferred embodiments. It is nevertheless intended that further modifications to the redundancy decoders and redundancy disable circuits disclosed herein may be made by those skilled in the art without departing from the scope and spirit of the present invention. Moreover, such modifications are considered to be within the purview of the appended claims.

We claim:

1. Apparatus for enabling a redundant word line in a semiconductor memory whenever selected memory address indicators are input to the semiconductor memory, said apparatus comprising:

decoder means for accessing the redundant word line and raising the voltage thereon, said decoder means including a first circuit structure which is programmed to receive the selected memory address indicators such that said decoder means accesses and raises the voltage on the redundant word line in response to the input of the selected memory address indicators to the semiconductor memory; and preventing the reprogramming of said first circuit structure with memory address indicators different than the selected memory address indicators after said first circuit structure has been programmed to receive the selected memory address indicators, said disabling means including a second circuit structure which outputs a signal indicative of the fact that said first circuit structure has been programmed.

2. Apparatus for enabling a redundant word line in a semiconductor memory whenever selected memory address indicators are input to the semiconductor memory, said apparatus comprising a decoder means for accessing the redundant word line and raising the voltage thereon, said decoder means including a first circuit structure which is programmed to receive the selected memory address indicators such that said decoder means accesses and raises the voltage on the redundant word line in response to the input of the selected memory address indicators to the semiconductor memory, said decoder means also including a second circuit structure which outputs a signal indicative of the fact that said first circuit structure has been programmed.

3. Apparatus as set forth in claims 1 or 2, wherein said decoder means further includes a first programming means operable to program said first circuit structure such that the voltage on the redundant word line is raised whenever the selected memory address indicators are input to the semiconductor memory, said first programming means having a circuit element connected to said second circuit structure, said circuit element assuming a first state to permit operation of said first programming means when said signal output from said second circuit structure is not present, said circuit element assuming a second state to prevent operation of said first programming means when said signal output from said second circuit structure is present.

4. Apparatus as set forth in claim 3, wherein said first circuit structure includes a series of first programmable circuits which may be individually programmed to respond to the input of the selected memory address indicators to the semiconductor memory, each of said first programmable circuits having at least one programmable device which is connected to prevent voltage on the redundant word line from being raised unless said first programmable circuit associated therewith has been programmed, and said first programming means further includes a first programming circuit which is connected to said first programmable circuits during the operation of said first programming means.

5. Apparatus as set forth in claim 4, wherein said first programmable circuits each include a pair of programmable devices, a selected one of which programmable devices is programmed by said first programming circuit during the operation of said first programming means.

6. Apparatus as set forth in claim 5, wherein each of said programmable devices comprises a fusable element connected between the redundant word line and ground.

7. An apparatus as set forth in claim 6, wherein said fusable element is a polysilcon fuse.

8. Apparatus as set forth in claim 6, wherein each of said first programmable circuits further includes a pair of gating devices respectively connected between said fusable elements and ground, said getting devices in said first prgrammable circuits responding to selected memory address indicators such that only said selected programmable devices are connected to ground when said selected memory address indicators are input to the semiconductor memory.

9. Apparatus as set forth in claim 3, wherein said first programming means includes a first switch means responsive to the condition of said circuit element for permitting said first programming means to operate when said circuit element is in said first state and for preventing said first programming means from operating when said circuit element is in said second state.

10. Apparatus as set forth in claim 9, wherein said first programming means includes a first source of programming current and said first switch means is connected between said first source of programming current and said first circuit structure.

11. Apparatus as set forth in claim 10, wherein said first circuit structure includes a series of first programmable circuits which may be individually programmed to respond to the input of the selected memory address indicators to the semiconductor memory.

12. Apparatus as set forth in claim 11, wherein each of said first programmable circuits includes at least one programmable device which is connected to prevent voltage on the redundant word line from being raised unless said first programmable circuit associated therewith has been prgrammed.

13. Apparatus as set forth in claim 12, wherein each of said programmable circuits includes a pair of programmable devices, a selected one of which programmable devices is programmed by said first programming means when said circuit element is in said first state.

14. Apparatus as set forth in claim 13, wherein each of said programmable devices comprises a fusable element connected between the redundant word line and ground.

15. Apparatus as set forth in claim 13, wherein each of said first programmable circuits further includes a pair of gating devices respectively connected between said programmable devices and ground and said first switch means in said first programming means is connected between said first source of programming current and the redundant word line such that current can flow from said first source of current through the redundant word line to each of said selected programmable devices in said programmable circuits only when said circuit element of said first programming means is in said first state but no current can flow from said first source of programming current through the redundant word line to said selected programmable devices when said circuit element is in said second state.

16. Apparatus as set forth in claim 15, wherein said gating devices are responsive to the the selected memory address indicators such that only said selected programmable devices are connected to ground when said selected memory address indicators are input to the semiconductor memory.

17. Apparatus as set forth in claim 9, wherein said first switch means is a first transistor having a gate connected to said circuit element of said first programming means.

18. Apparatus as set forth in claim 9, wherein said semiconductor memory includes a series of address buffers which receive memory address signals and output the memory address indicators as a function of the received memory address signals, at least a first of said address buffers having a first high voltage detection means for detecting when a high voltage signal is input to said address buffer in lieu of a memory address signal and for subsequently outputting a first control signal which is supplied to said first switch means in said first programming means such that said first switch means is responsive to said first control signal as well as to the condition of said circuit element.

19. Apparatus as set forth in claim 18, wherein said second circuit structure includes a programmable circuit which generates said signal indicative of the fact that said first circuit structure has been programmed, said second circuit structure also including a second programming means for programming said programmable circuit, said second programming means having source of programming current and a second switch means for conducting programming current from said second source of programming current to said programmable circuit.

20. Apparatus as set forth in claim 19, wherein a second address buffer in said series of address buffers includes a second high voltage detection means for outputting a second control signal when a high voltage signal is input to said second address buffer and said second switch means in said second programming means of said second circuit structure is responsive to said second control signal.

21. Apparatus as set forth in claim 20, wherein said second switch means in said second programming means of said second circuit structure is connected to receive said first control signal such that said second switch means is also responsive to said first control signal.

22. Apparatus as set forth in claim 1, wherein said second circuit structure includes a programmable circuit which generates said signal indicative of the fact that said first circuit structure has been programmed.

23. Apparatus as set forth in claim 22, wherein said programmable circuit is programmed to lock said second circuit structure into permanently outputting said signal indicative of the fact that said first circuit structure has been programmed.

24. Apparatus as set forth in claim 23, wherein said second circuit structure includes a programming means for programming said programmable circuit.

25. Apparatus as set forth in claim 24, wherein said programming means includes a source of programming current and a switch means for conducting programming current from said source of programming current to said programmable circuit.

26. Apparatus as set forth in claim 25, wherein said programmable circuit includes a fusable element which is blown in response to programming current received from source of programming current in order to lock said second circuit structure into permanently outputting said signal indicative of the fact that said first circuit structure has been programmed.

27. Apparatus as set forth in claim 1, wherein said semiconductor memory includes a series of address buffers which receive memory address signals and output the memory address indicators as a function of the received memory address signal, at least one of said address buffers having a high voltage detection means for detecting when a high voltage signal is input to said one of said address buffers in lieu of a memory address signal and for outputting at least one control signal in response thereto.

28. Apparatus as set forth in claim 2, wherein said decoder means includes a means for programming said first circuit structure.

29. Apparatus as set forth in claim 28, wherein said first circuit structure includes a series of programmable circuits.

30. Apparatus as set forth in claim 29, wherein an indicator switch means is connected between the redundant word line and a redundant access line to supply said signal indicative of the fact that said first circuit structure has been programmed.

* * * * *